(12) United States Patent
Jo

(10) Patent No.: US 11,315,485 B2
(45) Date of Patent: Apr. 26, 2022

(54) SHIFT REGISTER CIRCUIT AND LIGHT EMITTING DISPLAY DEVICE INCLUDING THE SHIFT REGISTER CIRCUIT

(71) Applicant: LG Display Co., Ltd., Seoul (KR)

(72) Inventor: SungHak Jo, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 17/129,502

(22) Filed: Dec. 21, 2020

(65) Prior Publication Data

US 2021/0201768 A1 Jul. 1, 2021

(30) Foreign Application Priority Data

Dec. 31, 2019 (KR) .................. 10-2019-0179488

(51) Int. Cl.
*G09G 3/32* (2016.01)
*G11C 19/28* (2006.01)

(52) U.S. Cl.
CPC .............. *G09G 3/32* (2013.01); *G11C 19/28* (2013.01); *G09G 2310/0202* (2013.01); *G09G 2310/0286* (2013.01)

(58) Field of Classification Search
CPC ............ G09G 3/32; G09G 2310/0286; G09G 2310/0289; G11C 19/28
See application file for complete search history.

(56) References Cited

U.S. PATENT DOCUMENTS

| 10,276,121 | B2 | 4/2019 | Kim et al. |
| 11,094,277 | B2* | 8/2021 | Zheng ................... G09G 3/3677 |
| 2014/0085285 | A1* | 3/2014 | Kim ........................ G11C 19/28 |
| | | | 345/211 |
| 2014/0159999 | A1 | 6/2014 | Gu et al. |
| 2015/0371598 | A1* | 12/2015 | So ............................ G09G 3/20 |
| | | | 345/212 |
| 2018/0004329 | A1* | 1/2018 | So ........................ G06F 3/04184 |
| 2020/0035184 | A1* | 1/2020 | Luo ....................... G09G 3/3677 |
| 2021/0210017 | A1* | 7/2021 | Feng ..................... G09G 3/3266 |

FOREIGN PATENT DOCUMENTS

| CN | 109559697 A | 4/2019 |
| KR | 10-2016-0086436 A | 7/2016 |
| KR | 10-2017-0079997 A | 7/2017 |

* cited by examiner

*Primary Examiner* — Sardis F Azongha
(74) *Attorney, Agent, or Firm* — Birch, Stewart, Kolasch & Birch, LLP

(57) ABSTRACT

A shift register circuit comprises a shift register, and a signal output circuit including J number of scan signal output circuits (J is an integer of 2 or more) operating by being connected with the shift register to respectively output J number of scan signals. The J number of scan signal output circuits share a first QB node and a second QB node of the shift register, a common output terminal of the shift register, and a first voltage line, operate based on a potential of the first QB node, a potential of the second QB node, a common output signal output through the common output terminal, a first voltage transferred through the first voltage line, and an Ith clock signal transferred through an Ith clock signal line, and output the J number of scan signals through output terminals which are respectively divided.

7 Claims, 12 Drawing Sheets

(a)

(a)

SHIFT REGISTER CIRCUIT AND LIGHT EMITTING DISPLAY DEVICE INCLUDING THE SHIFT REGISTER CIRCUIT

CROSS-REFERENCE TO RELATED APPLICATIONS

This application claims the benefit of priority to Korean Patent Application No. 10-2019-0179488, filed on Dec. 31, 2019 in the Republic of Korea, the entire contents of which are hereby expressly incorporated by reference into the present application.

BACKGROUND

Technical Field

The present disclosure relates to a shifter register circuit and a light emitting display device including the shift register circuit.

Description of the Related Art

With the advancement of the information technology, the market for a display device which is a connection medium between a user and information has grown. Therefore, various types of display devices such as a light emitting display (LED) device, a quantum dot display (QDD) device, and a liquid crystal display (LCD) device are increasingly used.

The aforementioned display devices comprise a display panel including subpixels, a driver circuit outputting a driving signal for driving the display panel, and a power supply generating a power source to be supplied to the display panel or the driver circuit.

Such display devices can display an image in such a manner that subpixels formed in the display panel transmit light or directly emit light if driving signals, for example, a scan signal and a data signal, are supplied to the subpixels.

Meanwhile, among the aforementioned display devices, the light emitting display device has advantages in view of electric and optical characteristics, such as fast response speed, high luminance and a wide viewing angle, and mechanical characteristic that enables the display device to be embodied in a flexible type. However, the light emitting display device needs to improve a structure and driving method of the display panel, and thus related continuous studies will be needed.

BRIEF SUMMARY

The present disclosure has been made in view of the above problems and other limitations associated with the background art, and it is an object of the present disclosure to provide a shift register circuit and a light emitting display device including the shift register circuit, in which driving stability of the circuit is improved and a uniform output is generated even though the circuit is embodied to output a plurality of scan signals based on circuits that share a node of a shift register.

It is another object of the present disclosure to provide a shift register circuit and a light emitting display device including the shift register circuit, in which a narrow bezel is embodied based on the circuit to output a plurality of scan signals.

In addition to the objects of the present disclosure as mentioned above, additional objects and features of the present disclosure will be clearly understood by those skilled in the art from the following description of the present disclosure.

In accordance with an aspect of the present disclosure, the above and other objects can be accomplished by the provision of a shift register circuit comprising a shift register, and a signal output circuit including J number of scan signal output circuits (J is an integer of 2 or more) operating by being connected with the shift register to respectively output J number of scan signals. The J number of scan signal output circuits share a first QB node and a second QB node of the shift register, a common output terminal of the shift register, and a first voltage line, operate based on a potential of the first QB node, a potential of the second QB node, a common output signal output through the common output terminal, a first voltage transferred through the first voltage line, and an Ith clock signal transferred through an Ith clock signal line, and output the J number of scan signals through output terminals which are respectively divided.

The J number of scan signal output circuits can include a first transistor turned on based on the first voltage, outputting the common output signal, a second transistor turned on based on the common output signal, outputting the J number of scan signals of a scan high voltage based on the Ith clock signal, a third transistor turned on based on the potential of the first QB node of the shift register, outputting the J number of scan signals of a scan low voltage based on a second voltage, and a fourth transistor turned on based on the potential of the second QB node of the shift register, outputting the J number of scan signals of a scan low voltage based on the second voltage.

The J number of scan signal output circuits can include a first transistor having a gate electrode connected to the first voltage line and a first electrode connected to the common output terminal of the shift register, a second transistor having a gate electrode connected to a second electrode of the first transistor, a first electrode connected to the Ith clock signal line, and a second electrode connected to an output terminal, a third transistor having a gate electrode connected to the first QB node of the shift register, a first electrode connected to the output terminal, and a second electrode connected to a second voltage line, and a fourth transistor having a gate electrode connected to the second QB node of the shift register, a first electrode connected to the output terminal, and a second electrode connected to the second voltage line.

In accordance with another aspect of the present disclosure, the above and other objects can be accomplished by the provision of a light emitting display device comprising a display panel displaying an image, and a signal output circuit connected to scan lines of the display panel, including a shift register and J number of scan signal output circuits (J is an integer of 2 or more) operating by being connected with the shift register to respectively output J number of scan signals, wherein the J number of scan signal output circuits share a first QB node and a second QB node of the shift register, a common output terminal of the shift register, and a first voltage line, operate based on a potential of the first QB node, a potential of the second QB node, a common output signal output through the common output terminal, a first voltage transferred through the first voltage line, and an Ith clock signal, and output the J number of scan signals through output terminals which are respectively divided.

The J number of scan signal output circuits can include a first transistor turned on based on the first voltage, outputting the common output signal, a second transistor turned on based on the common output signal, outputting the J number of scan signals of a scan high voltage based on the Ith clock signal, a third transistor turned on based on the potential of the first QB node of the shift register, outputting the J number of scan signals of a scan low voltage based on a second voltage, and a fourth transistor turned on based on the potential of the second QB node of the shift register, outputting the J number of scan signals of a scan low voltage based on the second voltage.

The J number of scan signal output circuits can include a first transistor having a gate electrode connected to the first voltage line and a first electrode connected to the common output terminal of the shift register, a second transistor having a gate electrode connected to a second electrode of the first transistor, a first electrode connected to the Ith clock signal line, and a second electrode connected to an output terminal, a third transistor having a gate electrode connected to the first QB node of the shift register, a first electrode connected to the output terminal, and a second electrode connected to a second voltage line, and a fourth transistor having a gate electrode connected to the second QB node of the shift register, a first electrode connected to the output terminal, and a second electrode connected to the second voltage line.

The J number of scan signal output circuits can include a first scan signal output circuit turned on to correspond to a potential of a first node, outputting a first scan signal, a second scan signal output circuit turned on to correspond to a potential of a second node, outputting a second scan signal, a third scan signal output circuit turned on to correspond to a potential of a third node, outputting a third scan signal, and a fourth scan signal output circuit turned on to correspond to a potential of a fourth node, outputting a fourth scan signal, and the first node to the fourth node can sequentially be charged with a high voltage.

According to the embodiments of the present disclosure, even though the circuit is embodied to output a plurality of scan signals based on the circuits that share the node of the shift register, voltage drop of the node can be prevented from occurring (load of the shared node can be prevented from being increased), whereby driving stability of the circuit can be improved and a uniform output can be generated. Also, since the number of transistors which are used can be reduced remarkably when the circuit for outputting the scan signals is embodied, a narrow bezel can be embodied even though a compensation circuit is added for increase of driving stability, reliability and lifespan of the circuit.

In addition to the effects of the present disclosure as mentioned above, additional advantages and features of the present disclosure will be clearly understood by those skilled in the art from the above description of the present disclosure.

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION OF THE DISCLOSURE

Hereinafter, details for carrying out the present disclosure will be described with reference to the accompanying drawings.

A display device according to the present disclosure can be embodied as, but not limited to, a television, a video player, a personal computer (PC), a home theater, a car electric equipment, a smart phone, etc. The display device can be embodied as a light emitting display (LED) device, a quantum dot display (QDD) device, a liquid crystal display (LCD) device, etc. Hereinafter, for convenience of description, a light emitting display device for displaying an image by directly emitting light will be described as an example. The light emitting display device can be embodied based on an inorganic light emitting diode or an organic light emitting diode. Hereinafter, for convenience of description, a description will be given based on the organic light emitting diode.

Moreover, a device which will be described later includes an N type thin film transistor as an example, but can be embodied as a P type thin film transistor or can be embodied as a type in which N type and P type thin film transistor coexist. The thin film transistor can be a three-electrode device including a gate, a source, and a drain. The source is an electrode supplying a carrier to the thin film transistor. In the thin film transistor, the carrier starts to flow from the source. The drain is an electrode supplying a carrier from the thin film transistor to the outside. For example, in the thin film transistor, the carrier flows from the source to the drain.

In an N-type thin film transistor, since the carrier is an electron, a source voltage is lower than a drain voltage such that the electron flows from the source to the drain. In the N-type thin film transistor, since the electron flows from the source to the drain, a current flows from the drain to the source. Unlike the N-type thin film transistor, in a P-type thin film transistor, since the carrier is a hole, the source voltage is higher than the drain voltage in order for the hole to flow from the source to the drain. In the P-type thin film transistor, since the hole flows from the source to the drain, a current flows from the source to the drain. However, the source and the drain of the thin film transistor can be changed in accordance with an applied voltage. In this regard, in the following description, any one of the source and the drain will be referred to as a first electrode and the other one will be referred to as a second electrode.

Figure 1:
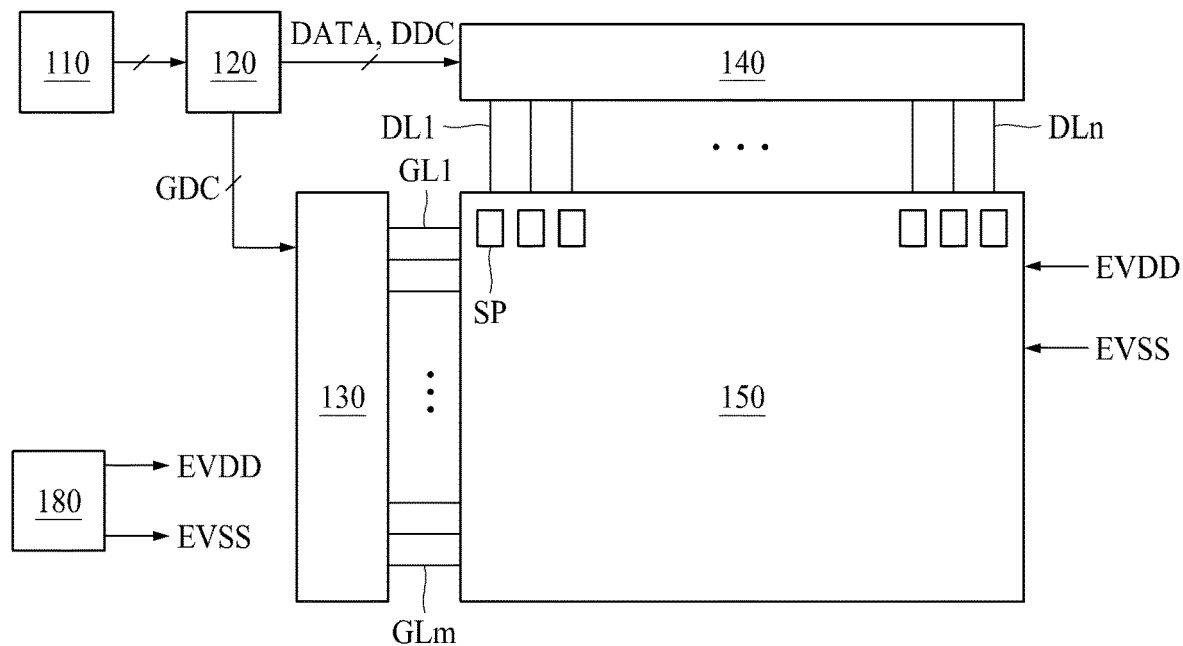
FIG. 1 is a block view illustrating an organic electroluminescent display device according to an embodiment of the present disclosure.
Figure 2:
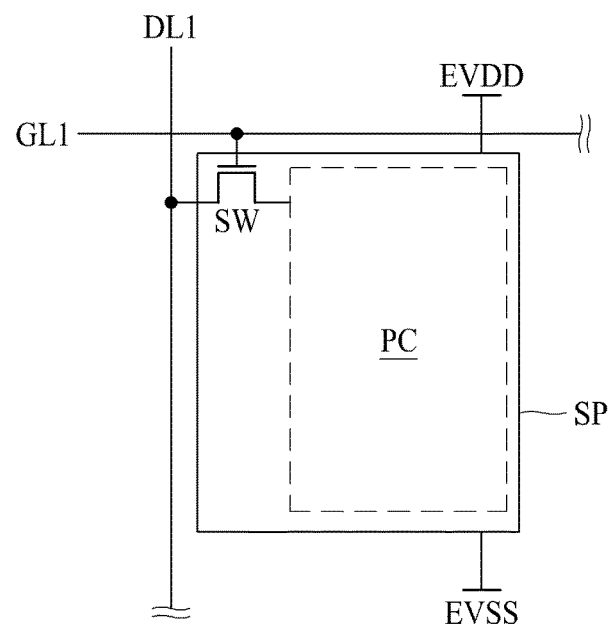
FIG. 2 is a schematic view illustrating an example of a subpixel shown in FIG. 1.

FIG. 1 is a block view illustrating an organic electroluminescent display device according to an embodiment of the present disclosure, and FIG. 2 is a schematic view illustrating an example of a subpixel shown in FIG. 1.

As shown in FIGS. 1 and 2, the electroluminescent display device according to the embodiment of the present disclosure includes an image supply 110, a timing controller 120, a scan driver 130, a data driver 140, a display panel 150, and a power supply 180.

The image supply 110 (or host system) outputs various driving signals together with an externally supplied image data signal or an image data signal stored in an internal memory. The image supply 110 can supply the data signal and various driving signals to the timing controller 120.

The timing controller 120 outputs a gate timing control signal GDC for controlling an operation timing of the scan driver 130, a data timing control signal DDC for controlling an operation timing of the data driver 140, and various synchronization signals (e.g., vertical synchronization signal Vsync and horizontal synchronization signal Hsync).

The timing controller 120 supplies a data signal DATA supplied from the image supply 110 to the data driver 140 together with the data timing control signal DDC. The timing controller 120 can be formed in the form of an integrated circuit (IC) and then packaged on a printed circuit board but is not limited thereto.

The scan driver 130 outputs a scan signal (or scan voltage) in response to the gate timing control signal GDC supplied from the timing controller 120. The scan driver 130 supplies the scan signal to subpixels included in the display panel 150 through scan lines GL1 to GLm where m is a positive number such as a positive integer. The scan driver 130 can be formed in the form of an IC (integrated circuit), or can directly be formed on the display panel 150 in the form of a GIP (gate in panel) but is not limited thereto.

The data driver 140 samples and latches the data signal DATA in response to the data timing control signal DDC supplied from the timing controller 120 and converts a digital type data signal to an analog type data voltage based on a gamma reference voltage.

The data driver 140 outputs the data voltage to the subpixels included in the display panel 150 through data lines DL1 to DLn where n is a positive number such as a positive integer. The data driver 140 can be formed in the form of an IC and packaged on the display panel 150 or the printed circuit board but is not limited thereto.

The power supply 180 outputs a first panel power source EVDD of a high potential and a second panel power source EVSS of a low potential based on an external input voltage which is externally supplied. The power supply 180 can generate and output a voltage needed for driving of the scan driver 130 or a voltage (drain voltage or half drain voltage) needed for driving of the data driver 140 as well as the first panel power source EVDD and the second panel power source EVSS.

The display panel 150 displays an image in response to the scan signal output from the driver that includes the scan driver 130 and the data driver 140, the driving signal that includes the data voltage, and the first and second panel power sources EVDD and EVSS output from the power supply 180. The subpixels of the display panel 150 directly emit light.

The display panel 150 can be manufactured based on a substrate having rigidity or flexibility, such as glass, silicon and polyimide. The subpixels emitting light can constitute a pixel that includes red, green and blue or a pixel that includes red, green, blue and white.

For example, one subpixel SP includes a pixel circuit that includes a switching transistor SW, a driving transistor, a storage capacitor, and an organic light emitting diode. Since the subpixel SP used in the organic electroluminescent display device directly emits light, its circuit structure is complicated. Also, there are various compensation circuits for compensating for degradation of a driving transistor supplying a driving current to the organic light emitting diode as well as the organic light emitting diode emitting light. Therefore, the pixel circuit PC included in the subpixel SP is shown in the form of a block.

Meanwhile, in the aforementioned description, the timing controller 120, the scan driver 130 and the data driver 140 are provided separately. However, one or more of the timing controller 120, the scan driver 130 and the data driver 140 can be integrated in one IC in accordance with an implementation manner of the light emitting display device.

Figure 3:
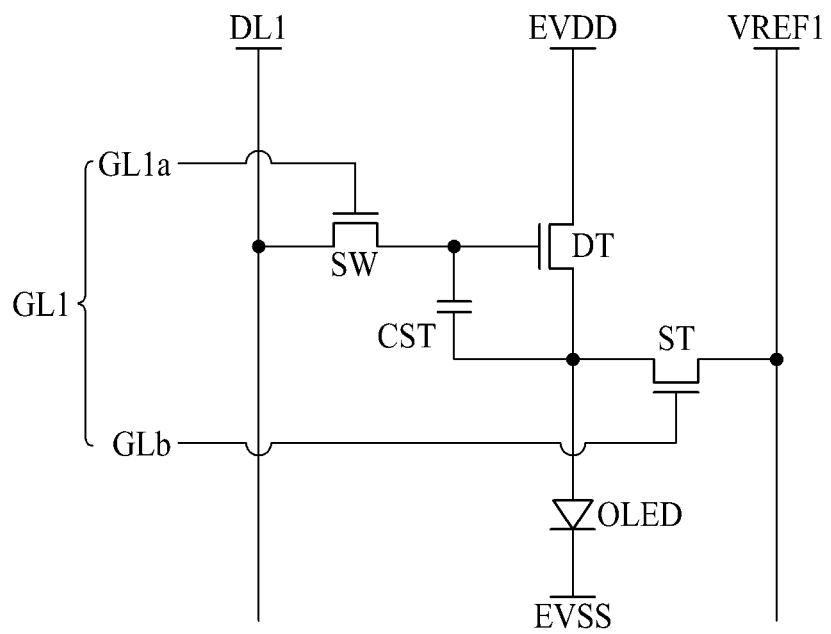
FIG. 3 is an equivalent circuit illustrating a subpixel that includes a compensation circuit according to the embodiment of the present disclosure.
Figure 4:
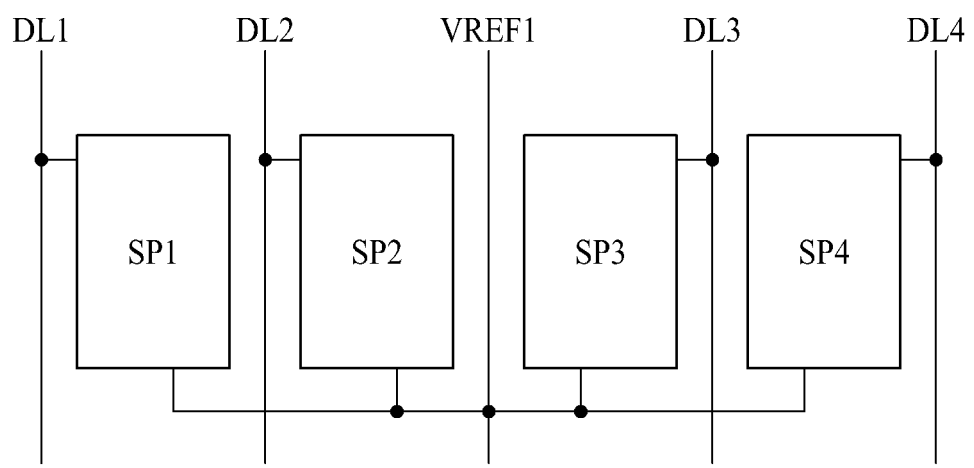
FIGS. 4 and 5 are views of examples of a pixel that can be embodied based on the subpixel of FIG. 3.
Figure 5:
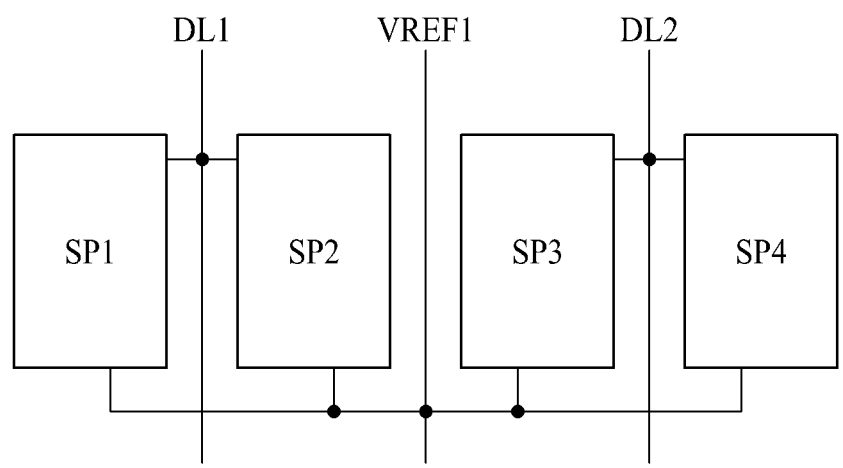

FIG. 3 is an equivalent circuit illustrating a subpixel that includes a compensation circuit according to the embodiment of the present disclosure, and FIGS. 4 and 5 are views illustrating examples of a pixel that can be embodied based on the subpixel of FIG. 3.

As shown in FIG. 3, the subpixel that includes a compensation circuit includes a switching transistor SW, a sensing transistor ST, a driving transistor DT, a capacitor CST, and an organic light emitting diode OLED.

A gate electrode of the switching transistor SW is connected to a 1Ath scan line GL1a, a first electrode of the switching transistor SW is connected to the first data line DL1, and a second electrode of the switching transistor SW is connected to the gate electrode of the driving transistor DT. A gate electrode of the driving transistor DT is connected to the capacitor CST, a first electrode of the driving transistor DT is connected to a first panel power line EVDD, and a second electrode of the driving transistor DT is connected to an anode electrode of the organic light emitting diode OLED.

A first electrode of the capacitor CST is connected to the gate electrode of the driving transistor DT, and a second electrode of the capacitor CST is connected to the anode electrode of the organic light emitting diode OLED. The anode electrode of the organic light emitting diode OLED is connected to the second electrode of the driving transistor DT, and a cathode electrode of the organic light emitting diode OLED is connected to a second panel power line EVSS. A gate electrode of the sensing transistor ST is connected to a 1Bth scan line GL1b, a first electrode of the sensing transistor ST is connected to a sensing line VREF, and a second electrode of the sensing transistor ST is connected to the anode electrode of the organic light emitting diode OLED, which is a sensing node.

The sensing transistor ST is a compensation circuit added to compensate for degradation or a threshold voltage of the driving transistor DT and the organic light emitting diode OLED. The sensing transistor ST obtains a sensing value through a sensing node defined between the driving transistor DT and the organic light emitting diode OLED. The sensing value obtained from the sensing transistor ST is transferred to an external compensation circuit provided outside the subpixel through the sensing line VREF.

The 1Ath scan line GL1a connected to the gate electrode of the switching transistor SW and the 1Bth scan line GL1b connected to the gate electrode of the sensing transistor ST can be detached from each other or commonly connected. A gate electrode common connection structure can reduce the number of scan lines which are used, and as a result, reduction of an opening ratio caused by addition of the compensation circuit can be avoided.

As shown in FIGS. 4 and 5, first to fourth subpixels SP1 to SP4 that include a compensation circuit according to the embodiment of the present disclosure can be defined to constitute one pixel. At this time, the first to fourth subpixels SP1 to SP4 can be disposed in the order of emitting red, green, blue and white but is not limited thereto.

In a first example as shown in FIG. 4, the first to fourth subpixels SP1 to SP4 that include a compensation circuit can be connected to share one sensing line VREF, and respectively connected to the first to fourth data lines DL1 to DL4.

In a second example as shown in FIG. 5, the first to fourth subpixels SP1 to SP4 that include a compensation circuit can be connected to share one sensing line VREF, and commonly connected to one data line in pairs. For example, the first and second subpixels SP1 and SP2 can share the first data line DL1, and the third and fourth subpixels SP3 and SP4 can share the second data line DL2.

However, FIGS. 4 and 5 show two examples but the present disclosure is applicable to a display panel having subpixels of another structure which is not described above. Also, the present disclosure is applicable to a structure having a compensation circuit in a subpixel or a structure having no compensation circuit in a subpixel.

Figure 6:
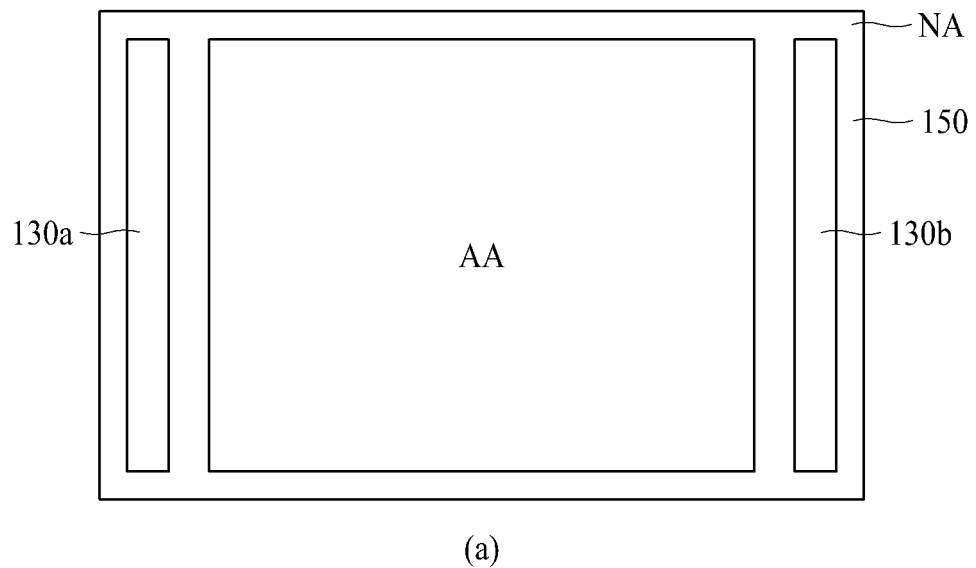
FIG. 6 is a view illustrating arrangement examples of a gate in panel type scan driver according to the embodiment of the present disclosure.
Figure 6:
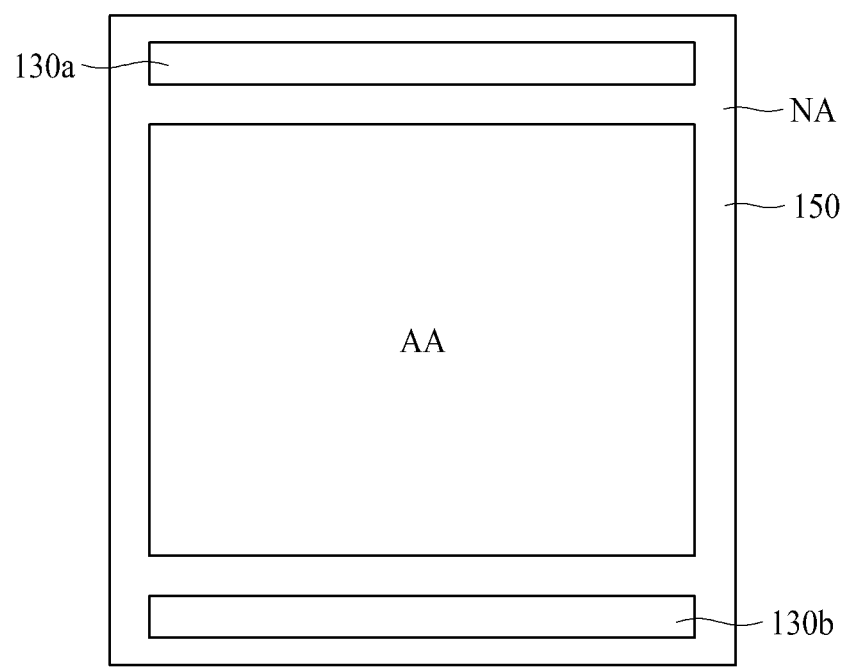
Figure 7:
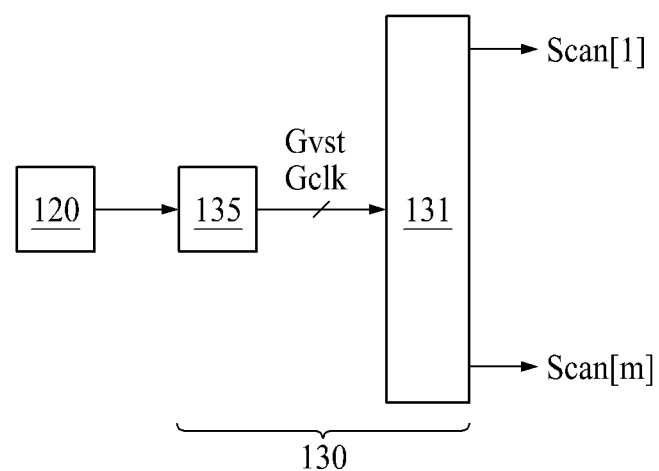
FIG. 7 is a first schematic exemplary view illustrating a device related to a gate in panel type scan driver.
Figure 8:
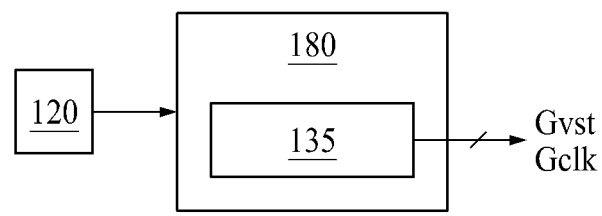
FIG. 8 is a second schematic exemplary view illustrating a device related to a gate in panel type scan driver.

FIG. 6 is a view illustrating arrangement examples of a gate in panel type scan driver according to the embodiment of the present disclosure, FIG. 7 is a first schematic exemplary view illustrating a device related to a gate in panel type scan driver, and FIG. 8 is a second schematic exemplary view illustrating a device related to a gate in panel type scan driver.

As shown in FIG. 6, gate in panel type scan drivers 130a and 130b are disposed in the non-display area NA of the display panel 150. The scan drivers 130a and 130b can be disposed in the non-display area NA at left and right sides of the display panel 150 as shown in (a) of FIG. 6. In another example, the scan drivers 130a and 130b can be disposed in the non-display area NA at upper and lower sides of the display panel 150 as shown in (b) of FIG. 6.

Although the scan drivers 130a and 130b are disposed in the non-display area NA arranged at the left and right sides or upper and lower sides of the display area AA in pairs in the above description as examples, one of the scan drivers 130a and 130b can be disposed at a left side, a right side, an upper side or a lower side and the present disclosure is not limited thereto.

As shown in FIG. 7, the gate in panel type scan driver 130 can include a shift register circuit 131 and a level shifter 135. The level shifter 135 generates and outputs a plurality of clock signals Gclk and a start signal Gvst based on the signals output from the timing controller 120. The plurality of clock signals Gclk can be generated and output in the form of K-phase (K is an integer of 2 or more) such as 2-phase, 4-phase, and 8-phase.

The shift register circuit 131 operates based on the signals Gclk and Gvst output from the level shifter 135, and outputs scan signals Scan[1] to Scan[m] that can turn on or turn off the transistor formed in the display panel. The shift register circuit 131 is formed on the display panel in the form of a thin film by a gate in panel manner. Therefore, the shift register circuit 131 (for example, 130a and 130b in FIG. 6 correspond to 131) can be a portion formed on the display panel in the scan driver 130.

Unlike the shift register circuit 131, the level shifter 135 is formed in the form of an IC. The level shifter 135 can be provided in the form of a separate IC as shown in FIG. 7, and can be included in the power supply 180 or another device as shown in FIG. 8.

Figure 9:
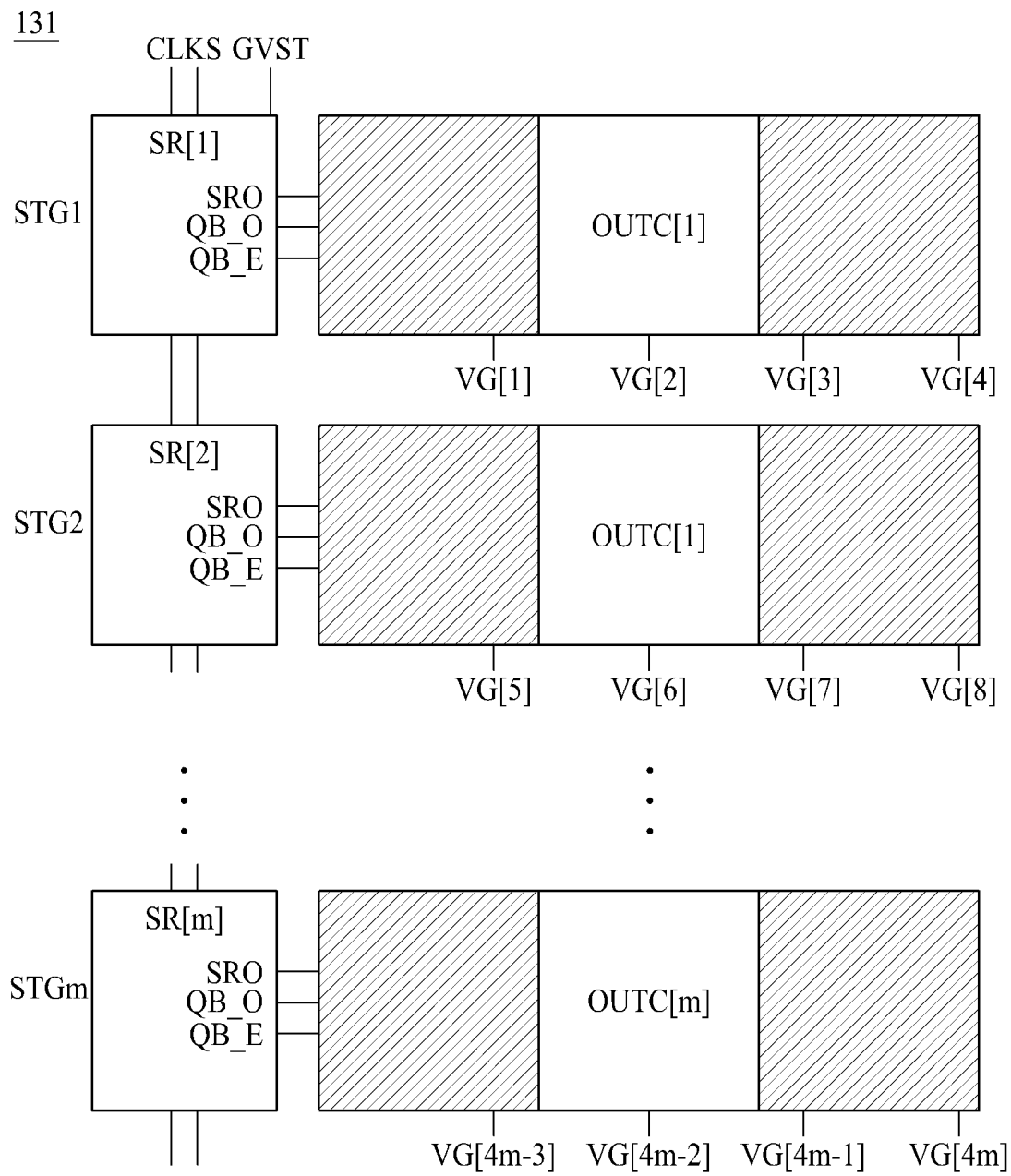
FIG. 9 is a view illustrating a shift register circuit according to the embodiment of the present disclosure.
Figure 10:
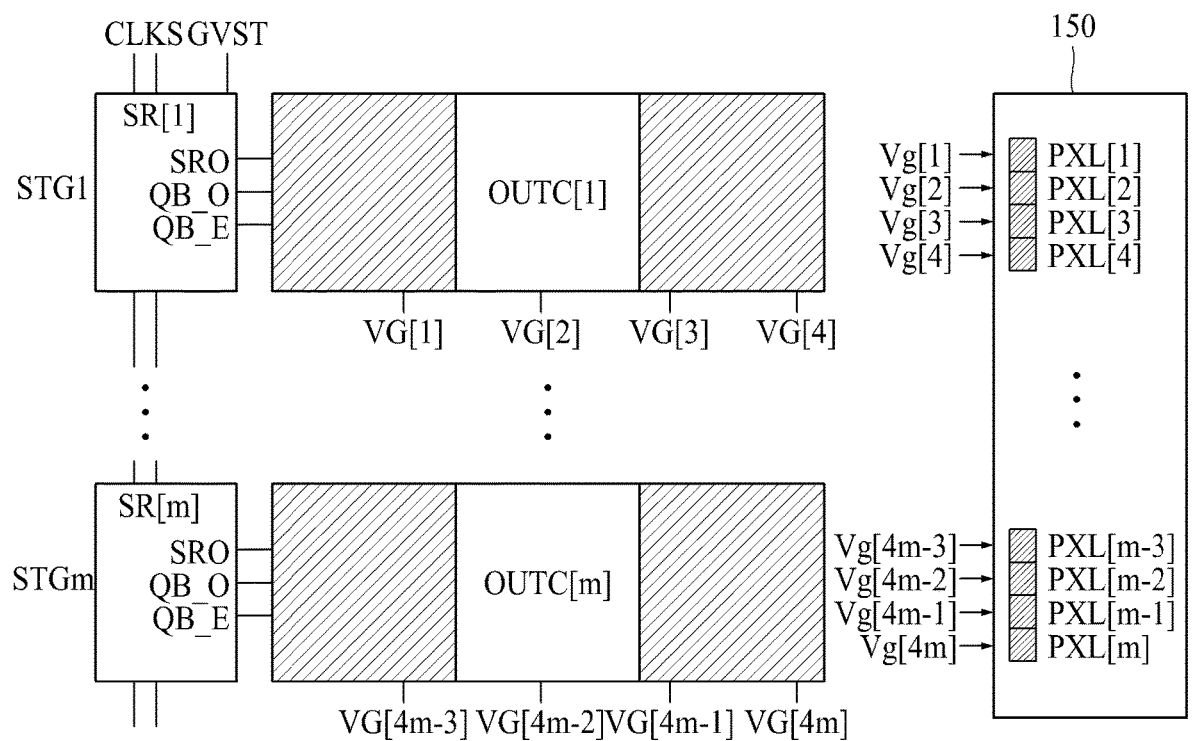
FIG. 10 is a view illustrating characteristics of a shift register circuit according to the embodiment of the present disclosure.
Figure 11:
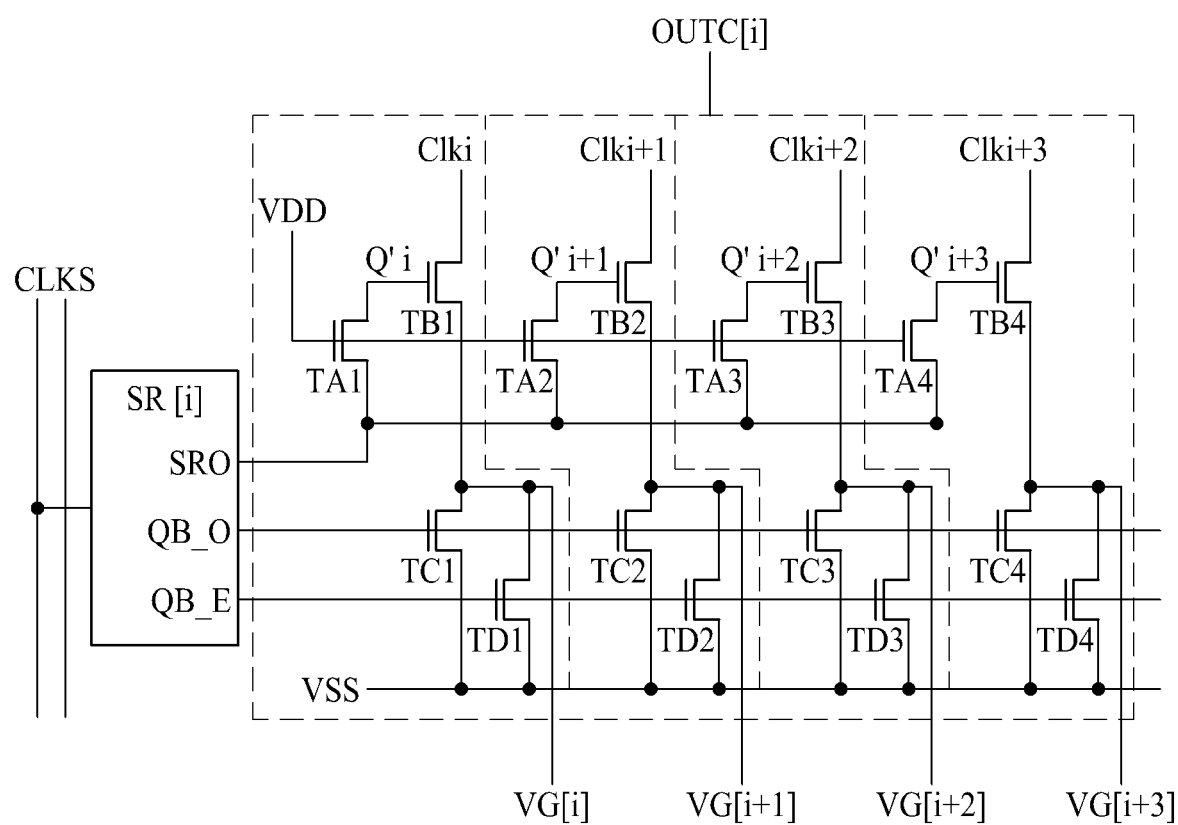
FIG. 11 is a detailed circuit view illustrating a signal output circuit of a shift register circuit according to the embodiment of the present disclosure.

FIG. 9 is a view illustrating a shift register circuit according to the embodiment of the present disclosure, FIG. 10 is a view illustrating characteristics of a shift register circuit according to the embodiment of the present disclosure, and FIG. 11 is a detailed circuit view illustrating a signal output circuit of a shift register circuit according to the embodiment of the present disclosure.

As shown in FIG. 9, the shift register circuit 131 includes a plurality of stages STG1 to STGm. The plurality of stages STG1 to STGm have a connection structure that the stages are dependent upon one another, and receive an output signal of at least one front end or rear end as an input signal. The stages STG1 to STGm of the shift register circuit 131 respectively include shift registers SR[1] to SR[m] and signal output circuits OUTC[1] to OUTC[m].

For example, the first stage STG1 includes a first shift register SR[1] and a first signal output circuit OUTC[1], the second stage STG2 includes a second shift register SR[2] and a second signal output circuit OUTC[1], and the Mth stage STGm includes an Mth shift register SR[m] and an Mth signal output circuit OUTC[m].

The shift registers SR[1] to SR[m] respectively have a common output terminal SRO, a first QB node QB_O and a second QB node QB_E. Each of the signal output circuits OUTC[1] to OUTC[m] has a plurality of output terminals. The signal output circuits OUTC[1] to OUTC[m] are respectively connected to the common output terminal SRO, the first QB node QB_O and the second QB node QB_E of the shift registers SR[1] to SR[m].

The potentials of the first QB node QB_O and the second QB node QB_E of the shift registers SR[1] to SR[m] are controlled by a plurality of transistors operating based on the voltage and clock signals applied through clock signal lines CLKS. The signal output circuits OUTC[1] to OUTC[m] operate based on the potentials of the first QB node QB_O and the second QB node QB_E of the shift registers SR[1] to SR[m], and respectively output J number of scan signals (J is an integer of 2 or more) through J number of output terminals. At this time, the first shift register SR[1] of the shift registers SR[1] to SR[m] starts to operate based on a start signal applied through a start signal line GVST, and the other second to Mth shift registers SR[2] to SR[m] start to operate based on the output signal at the front end.

The first signal output circuit OUTC[1] operates based on a common output signal (common output voltage) output from the common output terminal SRO of the first shift register SR[1] and the potentials of the first QB node QB_O and the second QB node QB_E, and output first to fourth scan signals through first to fourth output terminals VG[1] to VG[4]. The second signal output circuit OUTC[1] operates based on the common output signal output from the common output terminal SRO of the second shift register SR[2] and the potentials of the first QB node QB_O and the second QB node QB_E, and output fifth to eighth scan signals through fifth to eighth output terminals VG[5] to VG[8]. The Mth signal output circuit OUTC[m] operates based on the common output signal output from the common output terminal SRO of the Mth shift register SR[m] and the potentials of the first QB node QB_O and the second QB node QB_E, and output 4M-3th to 4Mth scan signals through 4M-3th to 4Mth output terminals VG[4m-3] to VG[4m].

As shown in FIG. 10, the first signal output circuit OUTC[1] included in the first stage STG1 outputs first to fourth scan signals Vg[1] to Vg[4] through first to fourth output terminals VG[1] to VG[4]. The Mth signal output circuit OUTC[m] included in the Mth stage STGm outputs 4M-3th to 4Mth scan signals VG[4m-3] to VG[4m] through 4M-3th to 4Mth output terminals VG[4m-3] to VG[4m].

The first scan signal Vg[1] output from the first signal output circuit OUTC[1] included in the first stage STG1 is supplied to first subpixels PXL[1] arranged in a first horizontal line, the second scan signal Vg[2] is supplied to second subpixels PXL[2] arranged in a second horizontal line, the third scan signal Vg[3] is supplied to third subpixels PXL[3] arranged in a third horizontal line, and the fourth scan signal Vg[4] is supplied to fourth subpixels PXL[4] arranged in a fourth horizontal line.

As will be aware of it from the above example(s), the shift register circuit 131 according to the embodiment outputs a plurality of scan signals, which can drive subpixels arranged in a plurality of horizontal lines, from one stage. On the other hand, a general shift register circuit outputs only one scan signal, which can drive subpixels arranged in one horizontal line, from one stage.

Therefore, the shift register circuit 131 according to the embodiment can also output a total of four scan signals from one stage not four stages. Since the shift register circuit 131 according to the embodiment can also output a plurality of scan signals based on circuits that share the node of the shift register, the number of transistors which are used can be reduced remarkably. Since the shift register circuit 131 according to the embodiment can remarkably reduce the number of transistors which are used, as compared with the existing case, even though a compensation circuit is added to increase driving stability, reliability and lifespan of the circuit, a narrow bezel can be embodied. Even though the shift register circuit 131 according to the embodiment is embodied to output a plurality of scan signals, voltage drop of the node can be avoided (load increase of the shared node can be avoided), whereby driving stability of the circuit can be improved and uniform output can be generated.

To this end, the signal output circuit included in each stage includes a total of four scan signal output circuits. Each scan signal output circuit operates based on a common output signal output from a common output terminal SRO of one shift register included in one stage and the potentials of the first QB node QB_O and the second QB node QB_E. Each of the scan signal output circuits includes a total of first to fourth transistors. The total of four transistors can be defined as buffer transistors.

As shown in FIG. 11, a signal output circuit OUTC[i] included in the Ith stage includes first to fourth scan signal output circuits that sequentially output first to fourth scan signals.

The first scan signal output circuit includes an A1th transistor TA1, a B1th transistor TB1, a C1th transistor TC1, and a D1th transistor TD1. A gate electrode of the A1th transistor TA1 is connected to the first voltage line VDD, a first electrode of the A1th transistor TA1 is connected to a common output terminal SRO of an Ith shift register SR[i] included in the Ith stage, and a second electrode of the A1th transistor TA1 is connected to a first node Q'i. A gate electrode of the B1th transistor TB1 is connected to the first node Q'i, a first electrode of the B1th transistor TB1 is connected to an Ith clock signal line Clki, and a second electrode of the B1th transistor TB1 is connected to an output terminal VG[i] of the first scan signal output circuit. A gate electrode of the C1th transistor TC1 is connected to the first QB node QB_O of the Ith shift register SR[i] included in the Ith stage, a first electrode of the C1th transistor TC1 is connected to the output terminal VG[i] of the first scan signal output circuit, and a second electrode of the C1th transistor TC1 is connected to the second voltage line VSS. A gate electrode of the D1th transistor TD1 is connected to the second QB node QB_E of the Ith shift register SR[i] included in the Ith stage, a first electrode of the D1th transistor TD1 is connected to the output terminal VG[i] of the first scan signal output circuit, and a second electrode of the D1th transistor TD1 is connected to the second voltage line VSS.

The second scan signal output circuit includes an A2th transistor TA2, a B2th transistor TB2, a C2th transistor TC2, and a D2th transistor TD2. A gate electrode of the A2th transistor TA2 is connected to the first voltage line VDD, a first electrode of the A2th transistor TA2 is connected to the common output terminal SRO of the Ith shift register SR[i] included in the Ith stage, and a second electrode of the A2th transistor TA2 is connected to a second node Q'i+1. A gate electrode of the B2th transistor TB2 is connected to the second node Q'i+1, a first electrode of the B2th transistor TB2 is connected to an I+1th clock signal line Clki+1, and a second electrode of the B2th transistor TB2 is connected to an output terminal VG[i+1] of the second scan signal output circuit. A gate electrode of the C2th transistor TC2 is connected to the first QB node QB_O of the Ith shift register SR[i] included in the Ith stage, a first electrode of the C2th transistor TC2 is connected to the output terminal VG[i+1] of the second scan signal output circuit, and a second electrode of the C2th transistor TC2 is connected to the second voltage line VSS. A gate electrode of the D2th transistor TD2 is connected to the second QB node QBE of the Ith shift register SR[i] included in the Ith stage, a first electrode of the D2th transistor TD2 is connected to the output terminal VG[i+1] of the second scan signal output circuit, and a second electrode of the D2th transistor TD2 is connected to the second voltage line VSS.

The third scan signal output circuit includes an A3th transistor TA3, a B3th transistor TB3, a C3th transistor TC3, and a D3th transistor TD3. A gate electrode of the A3th transistor TA3 is connected to the first voltage line VDD, a first electrode of the A3th transistor TA3 is connected to the common output terminal SRO of the Ith shift register SR[i] included in the Ith stage, and a second electrode of the A3th transistor TA3 is connected to a third node Q'i+2. A gate electrode of the B3th transistor TB3 is connected to the third node Q'i+2, a first electrode of the B3th transistor TB3 is connected to an I+2th clock signal line Clki+2, and a second electrode of the B3th transistor TB3 is connected to an output terminal VG[i+2] of the third scan signal output circuit. A gate electrode of the C3th transistor TC3 is connected to the first QB node QB_O of the Ith shift register SR[i] included in the Ith stage, a first electrode of the C3th transistor TC3 is connected to the output terminal VG[i+2] of the third scan signal output circuit, and a second electrode of the C3th transistor TC3 is connected to the second voltage line VSS. A gate electrode of the D3th transistor TD3 is connected to the second QB node QB_E of the Ith shift register SR[i] included in the Ith stage, a first electrode of the D3th transistor TD3 is connected to the output terminal VG[i+2] of the third scan signal output circuit, and a second electrode of the D3th transistor TD3 is connected to the second voltage line VSS.

The fourth scan signal output circuit includes an A4th transistor TA4, a B4th transistor TB4, a C4th transistor TC4, and a D4th transistor TD4. A gate electrode of the A4th transistor TA4 is connected to the first voltage line VDD, a first electrode of the A4th transistor TA4 is connected to the common output terminal SRO of the Ith shift register SR[i] included in the Ith stage, and a second electrode of the A4th transistor TA4 is connected to a fourth node Q'i+3. A gate electrode of the B4th transistor TB4 is connected to the fourth node Q'i+3, a first electrode of the B4th transistor TB4 is connected to an I+3th clock signal line Clki+3, and a second electrode of the B4th transistor TB4 is connected to an output terminal VG[i+3] of the fourth scan signal output circuit. A gate electrode of the C4th transistor TC4 is connected to the first QB node QB_O of the Ith shift register SR[i] included in the Ith stage, a first electrode of the C4th transistor TC4 is connected to the output terminal VG[i+3] of the fourth scan signal output circuit, and a second electrode of the C4th transistor TC4 is connected to the second voltage line VSS. A gate electrode of the D4th transistor TD4 is connected to the second QB node QBE of the Ith shift register SR[i] included in the Ith stage, a first electrode of the D4th transistor TD4 is connected to the output terminal VG[i+3] of the fourth scan signal output circuit, and a second electrode of the D4th transistor TD4 is connected to the second voltage line VSS.

Figure 12:
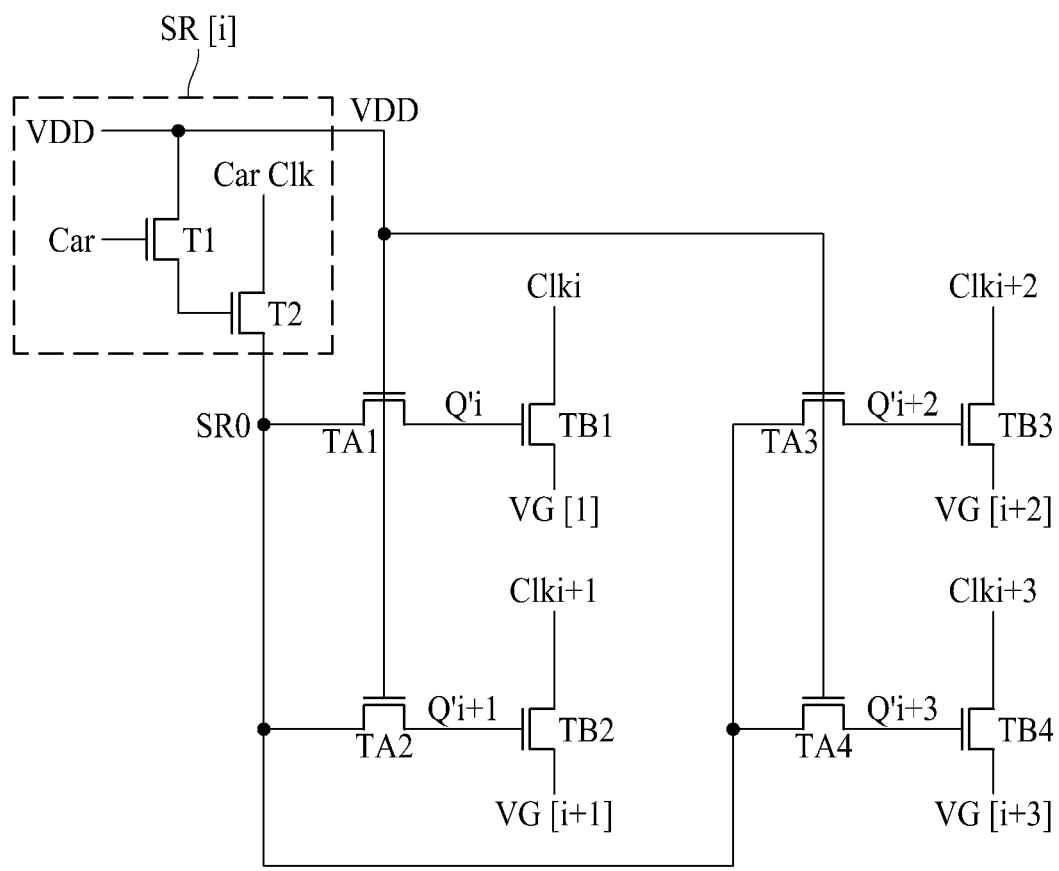
FIG. 12 is a view illustrating an operation of a signal output circuit according to the embodiment of the present disclosure.
Figure 13:
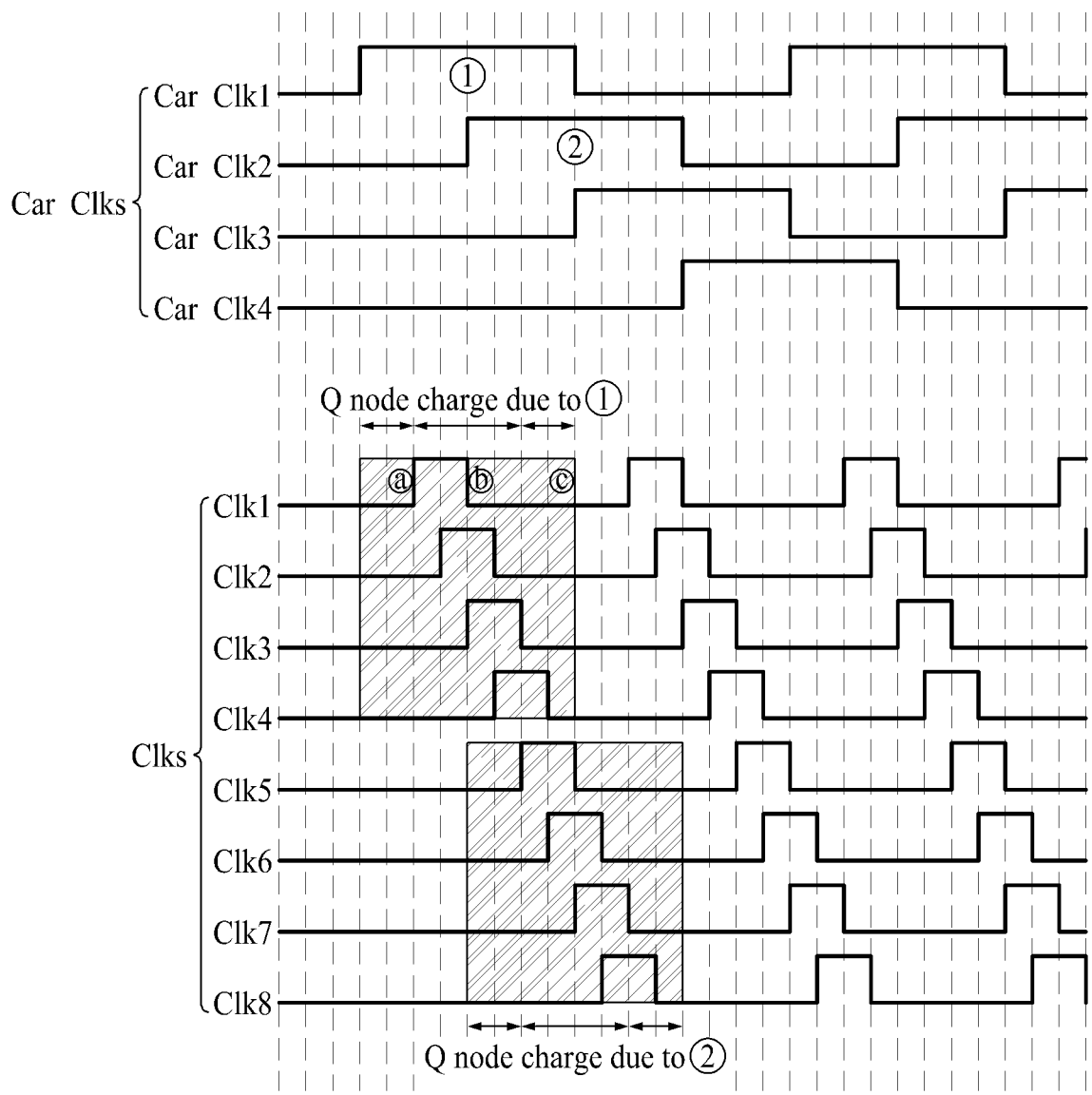
FIG. 13 show waveforms illustrating clock signals used for driving of a signal output circuit according to the embodiment of the present disclosure.
Figure 14:
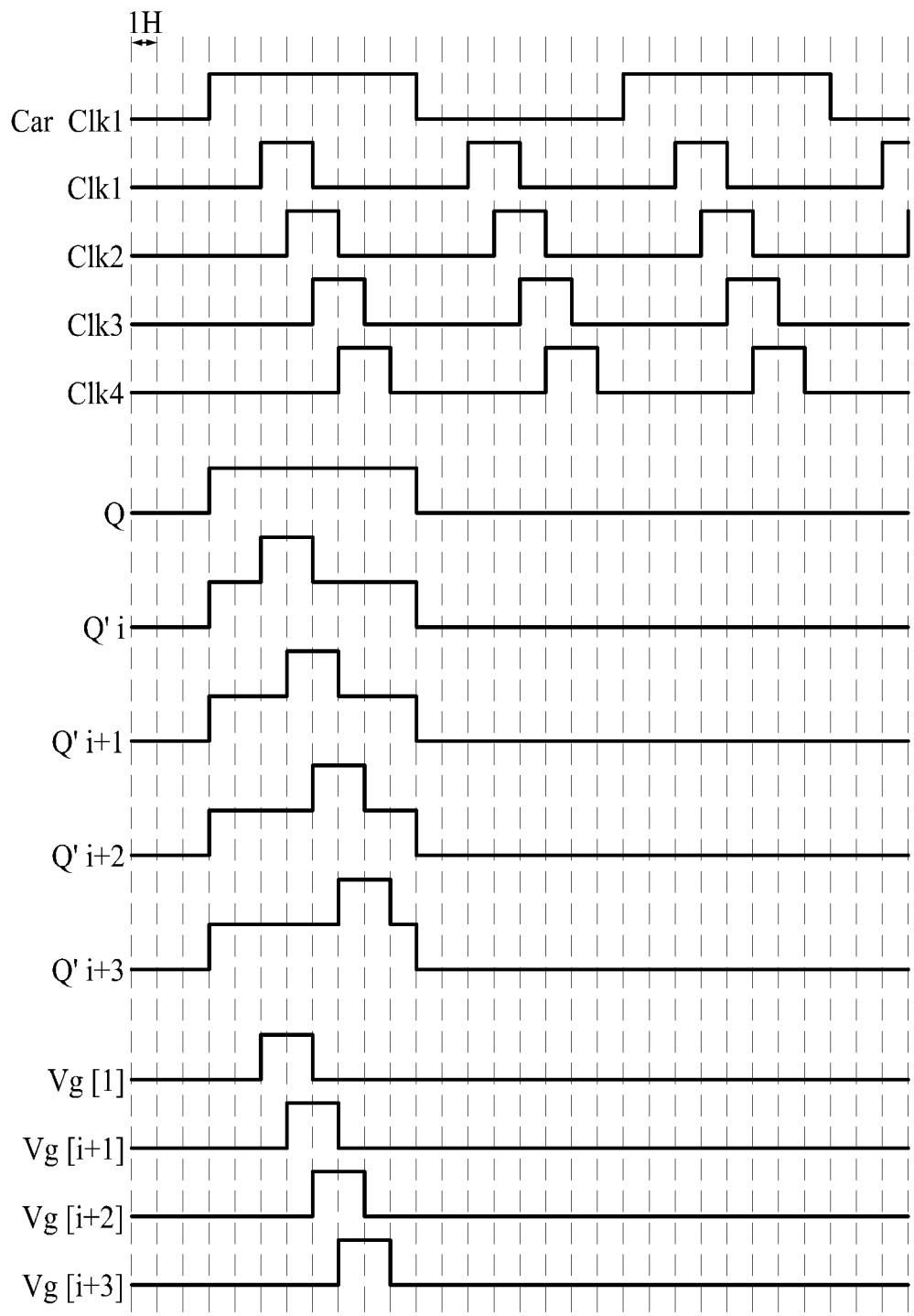
FIG. 14 is a view illustrating a node voltage and an output voltage of a signal output circuit according to the embodiment of the present disclosure.
Figure 15:
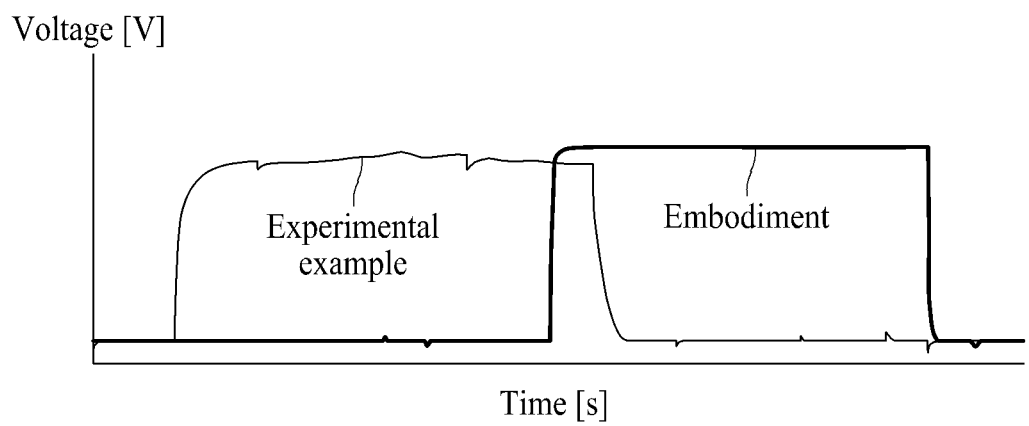
FIGS. 15 and 16 are views illustrating advantages of a signal output circuit according to the embodiment of the present disclosure.
Figure 16:
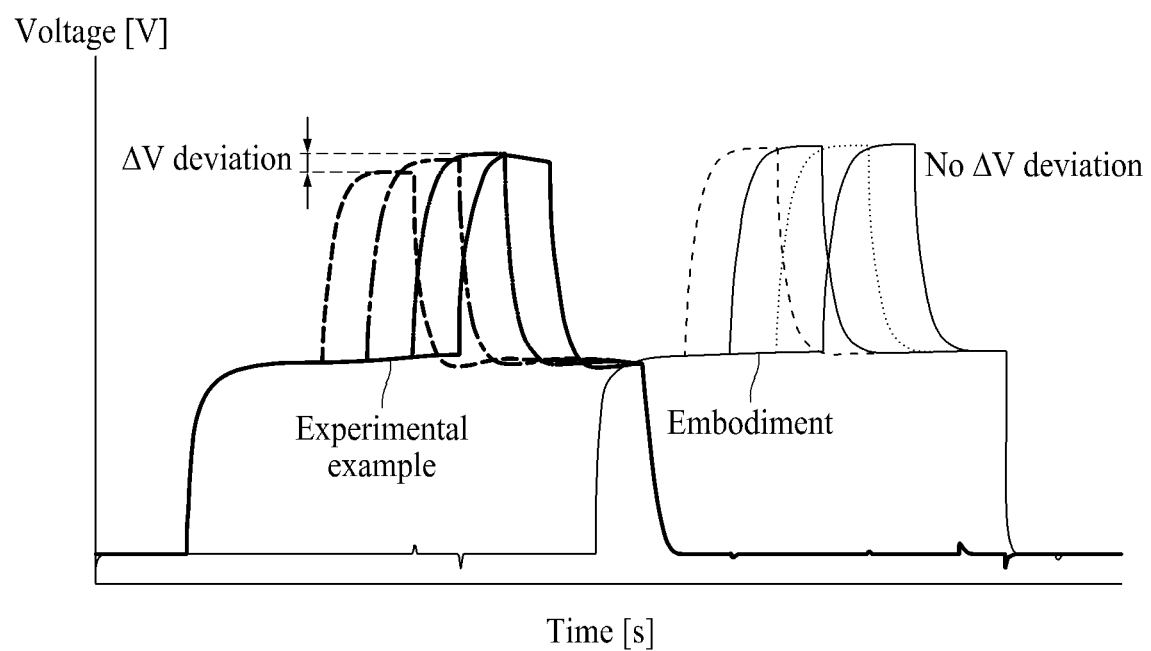

FIG. 12 is a view illustrating an operation of a signal output circuit according to the embodiment of the present disclosure, FIG. 13 shows waveforms illustrating clock signals needed for driving of a signal output circuit according to the embodiment of the present disclosure, FIG. 14 is a view illustrating a node voltage and an output voltage of a signal output circuit according to the embodiment of the present disclosure, and FIGS. 15 and 16 are views illustrating advantages of a signal output circuit according to the embodiment of the present disclosure.

As shown in FIGS. 12 to 14, the signal output circuit OUTC[i] of the Ith stage according to the embodiment of the present disclosure includes a total of four signal output circuits. A total of four 4-phase clocks signals Clk1 to Clk4 and a 1-phase carry clock signal Car Clk1 are needed to drive the signal output circuits. 8-phase clock signals Clk1 to Clk8 and 4-phase carry clock signals Car Clk1 to Car Clk4 are shown. This is because that a signal type has been shown, which needs four clock signals and one carry clock signal for one stage to drive a total of four stages. At this time, the 8-phase clock signals Clk1 to Clk8 and the 4-phase carry clock signals Car Clk1 to Car Clk4 are generated to be overlapped for a ½ period of a logic high such that a desired number of scan signals are output from each of the four signal output circuits. The overlap period of the logic high is at least one horizontal period or more.

Therefore, the first clock signal Clk1 and the second clock signal Clk2 have a logic high of an overlapped ½ period, the second clock signal Clk2 and the third clock signal Clk3 have a logic high of an overlapped ½ period, the third clock signal Clk3 and the fourth clock signal Clk4 have a logic high of an overlapped ½ period, the fourth clock signal Clk4 and the fifth clock signal Clk5 have a logic high of an overlapped ½ period, the fifth clock signal Clk5 and the sixth clock signal Clk6 have a logic high of an overlapped ½ period, the sixth clock signal Clk6 and the seventh clock signal Clk7 have a logic high of an overlapped ½ period, and the seventh clock signal Clk7 and the eighth clock signal Clk8 have a logic high of an overlapped ½ period. The first carry clock signal Car Clk1 and the second carry clock signal Car Clk2 have a logic high of an overlapped ½ period, the second carry clock signal Car Clk2 and the third carry clock signal Car Clk3 have a logic high of an overlapped ½ period, and the third carry clock signal Car Clk3 and the fourth carry clock signal Car Clk4 have a logic high of an overlapped ½ period.

Meanwhile, the 4-phase carry clock signals Car Clk1 to Car Clk4 should continue to maintain a logic high when a scan signal is output from a specific shift register. Therefore, when a shift register is shared in the form of 1:4 (the number of shift registers: the number of scan lines), the shift register should include a clock signal timing (scan clk timing) for outputting the corresponding scan signal. For example, a width of the carry clock signal (carry clk time width) can be set to a charge margin of an output buffer of the scan signal (scan buffer charge margin)+clock signal timing for outputting the scan signal (scan clk timing)+reset margin. In FIG. 14, a logic high sustain period of a Q node of the Ith shift register SR[i] and a logic high sustain period of a carry clock signal Car Clk1 can be equal to each other to hold a timing of the clock signal for outputting a plurality of scan signals.

Hereinafter, output of a total of four scan signals from the first to fourth scan signal output circuits included in the signal output circuit OUTC[i] of the Ith stage will be described with reference to FIGS. 11 to 14. However, in the following description, the operation of the signal output circuit OUTC[i] of the Ith stage will be described based on that after the Q node of the Ith shift register SR[i] is charged with a voltage of a logic high, a common output signal is output through the common output terminal SRO of the Q node. For reference, the Ith shift register SR[i] can output a common output signal of a logic high through the common output terminal SRO if the Q node is charged with the voltage of the logic high, and can output a common output signal of a logic low through the common output terminal SRO if the QB node is charged with the voltage of the logic high.

As shown in FIGS. 11 to 14, the first scan signal output circuit included in the signal output circuit OUTC[i] of the Ith stage outputs a first scan signal Vg[i] of a scan high voltage through its output terminal VG[i] if the A1th transistor TA1 and the B1th transistor TB1 are turned on. If the A1th transistor TA1 is turned on, the first node Q'i is charged with a high voltage. At this time, the high voltage of the first node Q'i has a high voltage level due to bootstrapping.

As the potential of the first node Q'i is changed to the high voltage, the B1th transistor TB1 is turned on. As the B1th transistor TB1 is turned on, the first scan signal Vg[i] of the scan high voltage provided based on the first clock signal Clki is output to the output terminal VG[i] of the first scan signal output circuit. On the other hand, if the C1th transistor TC1 or the D1th transistor TD1 is turned on, the first scan signal Vg[i] of the scan low voltage provided based on the second voltage is output.

The second scan signal output circuit included in the signal output circuit OUTC[i] of the Ith stage outputs a second scan signal Vg[i+1] of a scan high voltage through its output terminal VG[i+1] if the A2th transistor TA2 and the B2th transistor TB2 are turned on. If the A2th transistor TA2 is turned on, the second node Q'i+1 is charged with a high voltage. At this time, the high voltage of the second node Q'i+1 has a high voltage level due to bootstrapping. As the potential of the second node Q'i+1 is changed to the high voltage, the B2th transistor TB2 is turned on. As the B2th transistor TB2 is turned on, the second scan signal Vg[i+1]

of the scan high voltage provided based on the second clock signal Clki+1 is output to the output terminal VG[i+1] of the second scan signal output circuit. On the other hand, if the C2th transistor TC2 or the D2th transistor TD2 is turned on, the second scan signal Vg[i+1] of the scan low voltage provided based on the second voltage is output.

The third scan signal output circuit included in the signal output circuit OUTC[i] of the Ith stage outputs a third scan signal Vg[i+2] of a scan high voltage through its output terminal VG[i+2] if the A3th transistor TA3 and the B3th transistor TB3 are turned on. If the A3th transistor TA3 is turned on, the third node Q'i+2 is charged with a high voltage. At this time, the high voltage of the third node Q'i+2 has a high voltage level due to bootstrapping. As the potential of the third node Q'i+2 is changed to the high voltage, the B3th transistor TB3 is turned on. As the B3th transistor TB3 is turned on, the third scan signal Vg[i+2] of the scan high voltage provided based on the third clock signal Clki+2 is output to the output terminal VG[i+2] of the third scan signal output circuit. On the other hand, if the C3th transistor TC3 or the D3th transistor TD3 is turned on, the third scan signal Vg[i+2] of the scan low voltage provided based on the second voltage is output.

The fourth scan signal output circuit included in the signal output circuit OUTC[i] of the Ith stage outputs a fourth scan signal Vg[i+3] of a scan high voltage through its output terminal VG[i+3] if the A4th transistor TA4 and the B3th transistor TB3 are turned on. If the A4th transistor TA4 is turned on, the fourth node Q'i+3 is charged with a high voltage. At this time, the high voltage of the fourth node Q'i+3 has a high voltage level due to bootstrapping. As the potential of the fourth node Q'i+3 is changed to the high voltage, the B4th transistor TB4 is turned on. As the B4th transistor TB4 is turned on, the fourth scan signal Vg[i+3] of the scan high voltage provided based on the fourth clock signal Clki+3 is output to the output terminal VG[i+3] of the fourth scan signal output circuit. On the other hand, if the C4th transistor TC4 or the D4th transistor TD4 is turned on, the fourth scan signal Vg[i+3] of the scan low voltage provided based on the second voltage is output.

In the aforementioned description, bootstrapping for the first to fourth nodes Q'i to Q'i+3 means voltage rise due to coupling of parasitic capacitance existing between a gate electrode and a source electrode of each of the B1th transistor TB1 to the B4th transistor TB4 in accordance with voltages applied to electrodes of the B1th transistor TB1 to the B4th transistor.

Meanwhile, in the aforementioned description, the first output transistor T1 and the second output transistor T2 are shown as some of elements to which the Ith shift register SR[i] included in the Ith stage outputs the first driving voltage VDD and the common output signal. In this case, the first output transistor T1 and the second output transistor T2 can be defined as buffers for generating the output signal from the Ith shift register SR[i] included in the Ith stage.

Meanwhile, the first output transistor T1 is exemplarily shown based on that its gate electrode is connected to a carry signal output terminal Car, its first electrode is connected to the first voltage line VDD and its second electrode is connected to a gate electrode of the second output transistor T2. Also, the second output transistor T2 is exemplarily shown based on that its gate electrode is connected to the second electrode of the first output transistor T1, its first electrode is connected to a carry clock signal line Car Clk and its second electrode is commonly connected to the first electrodes of the A1th transistor TA1 to the A4th transistor TA4 of the scan signal output circuit. However, the structure and connection relation of the first output transistor T1 and the second output transistor T2 are only exemplary, and the present disclosure can be modified in various ways without limitation to the above example.

As will be aware of it from FIGS. 11 to 14, the high voltages charged in the first node Q'i to the fourth node Q'i+3 of the first to fourth scan signal output circuits included in the signal output circuit OUTC[i] of the Ith stage are sequentially generated while being overlapped with one another for some period due to the clock signals. As a result, the scan high voltages output from the output terminals VG[i] to VG[i+3] of the first to fourth scan signal output circuits included in the signal output circuit OUTC[i] of the Ith stage are also sequentially generated while being overlapped with one another for some period (e.g., ½ period).

As shown in FIGS. 15 and 16, the signal output circuit OUTC[i] of the Ith stage according to the embodiment of the present disclosure can prevent voltage drop of the node from occurring (prevent load of the shared node from being increased) even though the circuit is embodied to output a plurality of scan signals, whereby driving stability of the circuit can be improved and a uniform output can be generated (since the voltage of the shared node is enhanced, capability of the output buffer can be improved).

This is noted from comparison between the Q node voltage of the shift register in an experimental example and embodiment of FIG. 15 and the Q' node voltage of the signal output circuit in an experimental example and embodiment of FIG. 16.

The experimental example is a structure that the first transistors (TA1 to TA4 of FIG. 11) included in the scan signal output circuit share the Q node voltage of the shift register, and the embodiment is a structure that the first transistors (TA1 to TA4 of FIG. 11) included in the scan signal output circuit share the common output signal of the shift register.

As will be aware of it from comparison in FIG. 15, if the scan signal output circuit is embodied to share the Q node voltage of the shift register like the experimental example, node voltage drop can occur due to line load increment of the Q node. However, if the scan signal output circuit is embodied to share the common output signal of the shift register like the embodiment, since the Q node is not shared, line load increment of the Q node is not caused, whereby node drop voltage does not occur.

Also, as will be aware of it from comparison in FIG. 16, if the scan signal output circuit is embodied to share the Q node voltage of the shift register like the experimental example, deviation of the voltage charged in the Q' node per scan signal output circuit can occur. This is because that voltage drop based on line load increment of the Q node can be caused as described in the experimental example of FIG. 15, and the Q' node can be affected by the voltage to make a uniform charge difficult.

However, if the scan signal output circuit is embodied to share the output signal of the shift register like the embodiment, since deviation of the voltage charged in the Q' node per scan signal output circuit does not occur, a uniform output can be generated and maintained. This is because that the Q node, which can cause voltage drop, is not shared as described in the embodiment of FIG. 15, and line node increment of the Q node can be excluded by use of the output signal of the shift register.

As described above, according to the present disclosure, even though the circuit is embodied to output a plurality of scan signals based on the circuits that share the node of the shift register, voltage drop of the node can be prevented from occurring (load of the shared node can be prevented from being increased), whereby driving stability of the circuit can be improved and a uniform output can be generated. Also, since the number of transistors which are used can be reduced remarkably when the circuit for outputting the scan signals is embodied, a narrow bezel can be embodied even though a compensation circuit is added for increase of driving stability, reliability and lifespan of the circuit.

It will be apparent to those skilled in the art that the present disclosure described above is not limited by the above-described embodiments and the accompanying drawings and that various substitutions, modifications, and variations can be made in the present disclosure without departing from the spirit or scope of the disclosures. Consequently, the scope of the present disclosure is defined by the accompanying claims, and it is intended that all variations or modifications derived from the meaning, scope, and equivalent concept of the claims fall within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A shift register circuit comprising:
   a shift register; and
   a signal output circuit including J number of scan signal output circuits connected with the shift register to respectively output J number of scan signals, J being an integer of 2 or more,
   wherein the J number of scan signal output circuits share a first QB node and a second QB node of the shift register, a common output terminal of the shift register, and a first voltage line,
   the J number of scan signal output circuits operate based on a potential of the first QB node, a potential of the second QB node, a common output signal output through the common output terminal, a first voltage transferred through the first voltage line, and an Ith clock signal transferred through an Ith clock signal line, I being a positive number,
   the J number of scan signal output circuits output the J number of scan signals through output terminals which are respectively divided, and
   the J number of scan signal output circuits include a first transistor turned on based on the first voltage, outputting the common output signal.

2. The shift register circuit of claim 1, wherein the J number of scan signal output circuits further include:
   a second transistor turned on based on the common output signal, outputting the J number of scan signals of a scan high voltage based on the Ith clock signal;
   a third transistor turned on based on the potential of the first QB node of the shift register, outputting the J number of scan signals of a scan low voltage based on a second voltage; and
   a fourth transistor turned on based on the potential of the second QB node of the shift register, outputting the J number of scan signals of a scan low voltage based on the second voltage.

3. The shift register circuit of claim 1, wherein the first transistor having a gate electrode connected to the first voltage line and a first electrode connected to the common output terminal of the shift register, and
   wherein the J number of scan signal output circuits further include:
   a second transistor having a gate electrode connected to a second electrode of the first transistor, a first electrode connected to the Ith clock signal line, and a second electrode connected to an output terminal;
   a third transistor having a gate electrode connected to the first QB node of the shift register, a first electrode connected to the output terminal, and a second electrode connected to a second voltage line; and
   a fourth transistor having a gate electrode connected to the second QB node of the shift register, a first electrode connected to the output terminal, and a second electrode connected to the second voltage line.

4. A light emitting display device comprising:
   a display panel configured to display an image; and
   a signal output circuit connected to scan lines of the display panel, the signal output circuit including a shift register and J number of scan signal output circuits connected with the shift register to respectively output J number of scan signals, J being an integer of 2 or more,
   wherein the J number of scan signal output circuits share a first QB node and a second QB node of the shift register, a common output terminal of the shift register, and a first voltage line,
   the J number of scan signal output circuits operate based on a potential of the first QB node, a potential of the second QB node, a common output signal output through the common output terminal, a first voltage transferred through the first voltage line, and an Ith clock signal, where I is a positive number,
   the J number of scan signal output circuits output the J number of scan signals through output terminals which are respectively divided, and
   the J number of scan signal output circuits include a first transistor turned on based on the first voltage, outputting the common output signal.

5. The light emitting display device of claim 4, wherein the J number of scan signal output circuits further include:
   a second transistor turned on based on the common output signal, outputting the J number of scan signals of a scan high voltage based on the Ith clock signal;
   a third transistor turned on based on the potential of the first QB node of the shift register, outputting the J number of scan signals of a scan low voltage based on a second voltage; and
   a fourth transistor turned on based on the potential of the second QB node of the shift register, outputting the J number of scan signals of a scan low voltage based on the second voltage.

6. The light emitting display device of claim 4, wherein the first transistor having a gate electrode connected to the first voltage line and a first electrode connected to the common output terminal of the shift register, and wherein the J number of scan signal output circuits further include:
a second transistor having a gate electrode connected to a second electrode of the first transistor, a first electrode connected to the Ith clock signal line, and a second electrode connected to an output terminal;
a third transistor having a gate electrode connected to the first QB node of the shift register, a first electrode connected to the output terminal, and a second electrode connected to a second voltage line; and
a fourth transistor having a gate electrode connected to the second QB node of the shift register, a first electrode connected to the output terminal, and a second electrode connected to the second voltage line.

7. The light emitting display device of claim 4, wherein the J number of scan signal output circuits further include:
a first scan signal output circuit turned on to correspond to a potential of a first node, outputting a first scan signal;
a second scan signal output circuit turned on to correspond to a potential of a second node, outputting a second scan signal;
a third scan signal output circuit turned on to correspond to a potential of a third node, outputting a third scan signal; and
a fourth scan signal output circuit turned on to correspond to a potential of a fourth node, outputting a fourth scan signal, and
the first node to the fourth node are sequentially charged with a high voltage.

* * * * *